(12) United States Patent
Nielson

(10) Patent No.: US 6,867,677 B2
(45) Date of Patent: Mar. 15, 2005

(54) ON-CHIP INDUCTIVE STRUCTURE

(75) Inventor: John Nielson, Hillerød (DK)

(73) Assignee: Nokia Corporation, Espoo (FI)

( * ) Notice: Subject to any disclaimer, the term of this patent is extended or adjusted under 35 U.S.C. 154(b) by 35 days.

(21) Appl. No.: 10/153,869

(22) Filed: May 24, 2002

(65) Prior Publication Data

US 2002/0175799 A1 Nov. 28, 2002

Related U.S. Application Data

(60) Provisional application No. 60/292,912, filed on May 24, 2001.

(51) Int. Cl.[7] ................................................. H01F 5/00
(52) U.S. Cl. ........................................ 336/200; 336/232
(58) Field of Search ..................... 336/65, 83, 180–183, 336/200, 232

(56) References Cited

U.S. PATENT DOCUMENTS

| | | | | |
|---|---|---|---|---|
| 4,816,784 A | * | 3/1989 | Rabjohn | 333/24 R |
| 4,992,769 A | * | 2/1991 | Oppelt | 336/180 |
| 5,781,071 A | * | 7/1998 | Kusunoki | 330/269 |
| 5,892,425 A | * | 4/1999 | Kuhn et al. | 336/200 |
| 6,476,704 B2 | * | 11/2002 | Goff | 336/200 |
| 6,577,219 B2 | * | 6/2003 | Visser | 336/200 |
| 6,580,334 B2 | * | 6/2003 | Simburger et al. | 333/24 R |
| 6,608,364 B2 | * | 8/2003 | Carpentier | 257/531 |

FOREIGN PATENT DOCUMENTS

FR        2 819 938          7/2002

OTHER PUBLICATIONS

John R. Long, "Monolithic Transformers for Silicon RF IC Design", IEEE Journal of Solid–State Circuits, vol. 35, No. 9, Sep. 2000.

Simburger Werner, "A Monolithic Transformer Coupled 5–W Silicon Power Amplifier with 59% PAE at 0.9 GHz", IEEE Journal of Solid–State Circuits, vol. 34, No. 12, Dec., 1999.

* cited by examiner

*Primary Examiner*—Tuyen T. Nguyen
(74) *Attorney, Agent, or Firm*—Antonelli, Terry, Stout & Kraus, LLP

(57) ABSTRACT

An on-chip inductive structure, such as the load inductors of a push-pull amplifier, comprises a substrate and first and second inductors connected in series and formed on the substrate. The inductors spiral in opposite sense about a common center in substantially the same plane.

8 Claims, 3 Drawing Sheets

ON-CHIP INDUCTIVE STRUCTURE

This application claims priority of U.S. Provisional Patent Application No. 60/292,912 filed on May 24, 2001.

DESCRIPTION

The present invention relates to an on-chip inductive structure.

For many years, inductive components for radio circuits operating at VHF and UHF frequencies were made by forming copper wire into self-supporting helices. However, the development of printed circuit board techniques and subsequently the desire to incorporate inductors into integrated circuits has led to inductor designs employing planar spiral forms.

Certain inductor designs require two coils, wound in the same sense, to be connected in series and share a common magnetic circuit.

It is an aim of the present invention to provide an on-chip inductive device with good matching between inductors in respect of inductance resistance and parasitic capacitance.

According to the present invention, there is provided an on-chip inductor structure comprising a substrate and first and second inductors connected in series and formed on the substrate, wherein the inductors spiral in opposite senses about a common centre in substantially the same plane.

Preferably, first inductor alternately passes over and under the second inductor as it spirals about said centre. More preferably, the first inductor passes under the second inductors in a trough formed in a dielectric layer on the substrate. Still more preferably, the spiralling in of the inductors is caused by inward path transitions where the first inductor passes over or under the second inductor.

The turns of inductors may be substantially rectangular. Preferably; the turns are substantially square.

Preferably, the device exhibits at least one degree of mirror symmetry, to a substantial extent, along a line in said plane. In a preferred embodiment, the symmetry is only disturbed by the crossings of the spirals which require one or both of the spirals to digress out of the main plane of the device.

A push-pull amplifier may have load inductors which constitute a structure according to the present invention. In this case, the inductive structure may include output signal paths following peripheral routes around respective halves thereof.

An embodiment of the present invention will now be described, by way of example, with reference to the accompanying drawings, in which.

Figure 1:
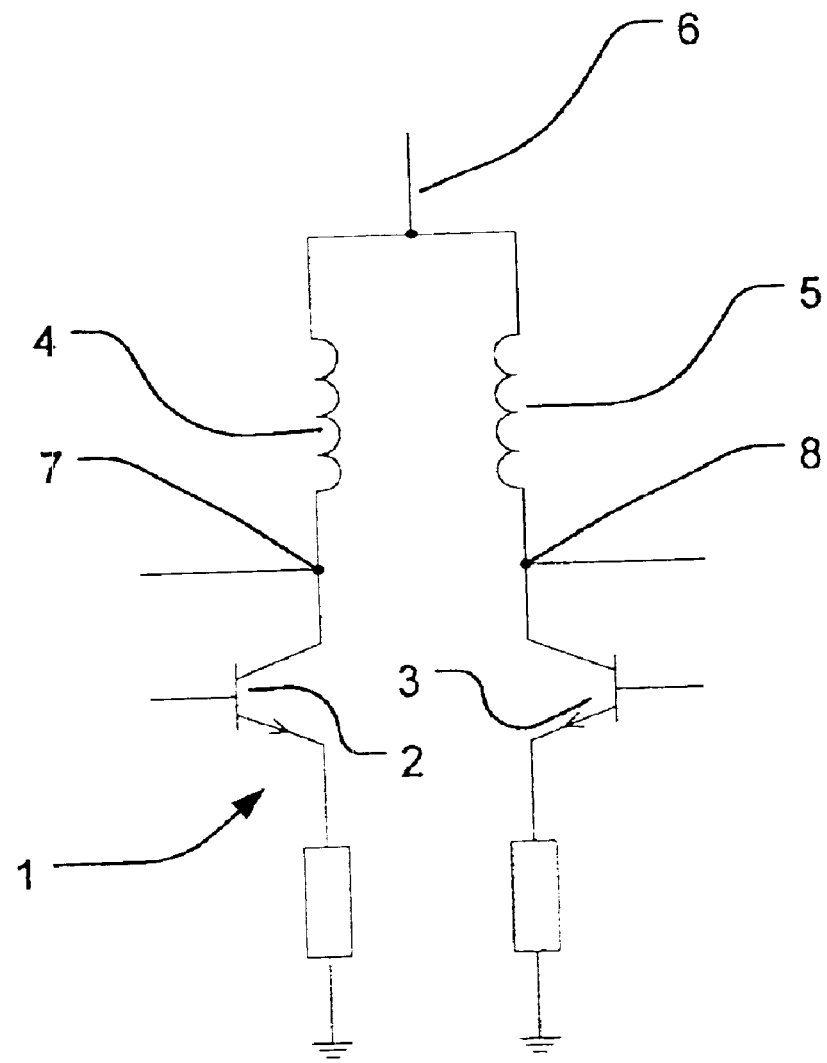
FIG. 1 is a circuit diagram illustrating push-pull amplifier having load inductors according to the present invention.

Referring to FIG. 1, a push-pull amplifier 1 comprises a first and second transistors 2, 3 and a pair of load inductors 4, 5 connected between the collectors 7, 8 of respective transistors 2, 3 and a positive voltage line 6. The amplifier's output is taken between the collectors of the transistors 2, 3.

Figure 2:
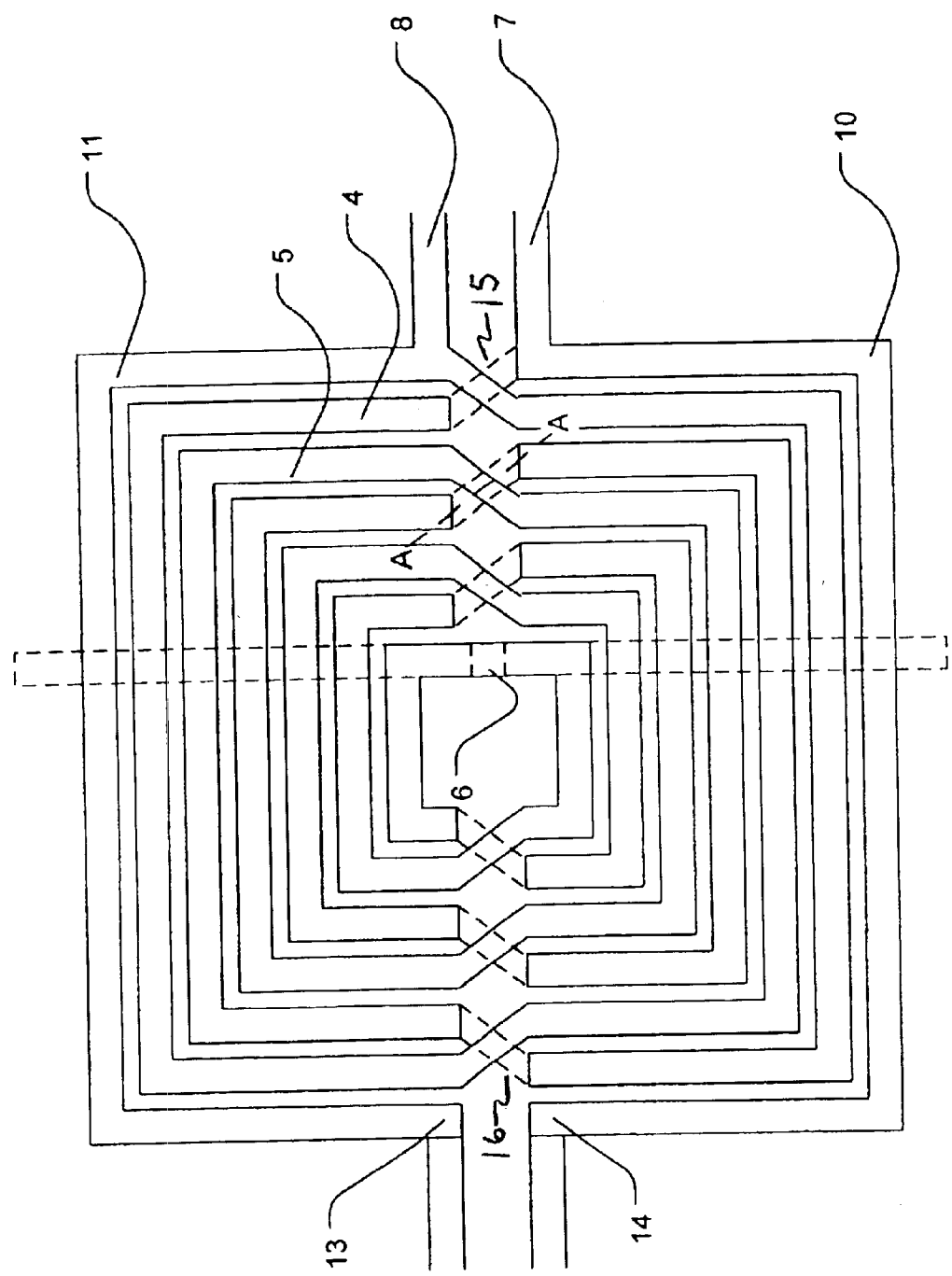
FIG. 2 is a simplified plan view of an inductive structure according to the present invention.

Referring to FIG. 2, the load inductors 4, 5 together form a generally square inductive structure. The inductors' ends, which are connected to the collectors 7, 8, are close together centrally on one side of the structure. The output is taken by peripheral paths 10, 11 around the load inductors 4, 5 to points 13, 14 opposite the collector nodes.

The inductors 4, 5 spiral in opposite senses to the centre of the inductive structure. The spiral paths of the inductors 4, 5 are squared, stepping in twice in each turn at points 180° apart. These points are located on an axis extending between the collector connections and the output points 13, 14. FIG. 2 shows 3 turns in each of the inductors 4, 5 and it will be appreciated that there may be many more in practice.

The paths of inductors 4, 5 cross each other where they step in. On the transistor side of the inductive structure, the first inductor 4 passes under the second inductor 5 in a trough (dotted lines) 15 formed in a dielectric layer on the substrate and, on the other side of the inductive structure, the second inductor 5 passes under the first inductor 4 in a trough (dotted lines) 16 formed in a dielectric layer on the substrate.

The positive voltage line 6 passes under the inductive structure and is connected to the central point where the first and second inductors 4, 5 meet.

Figure 3:
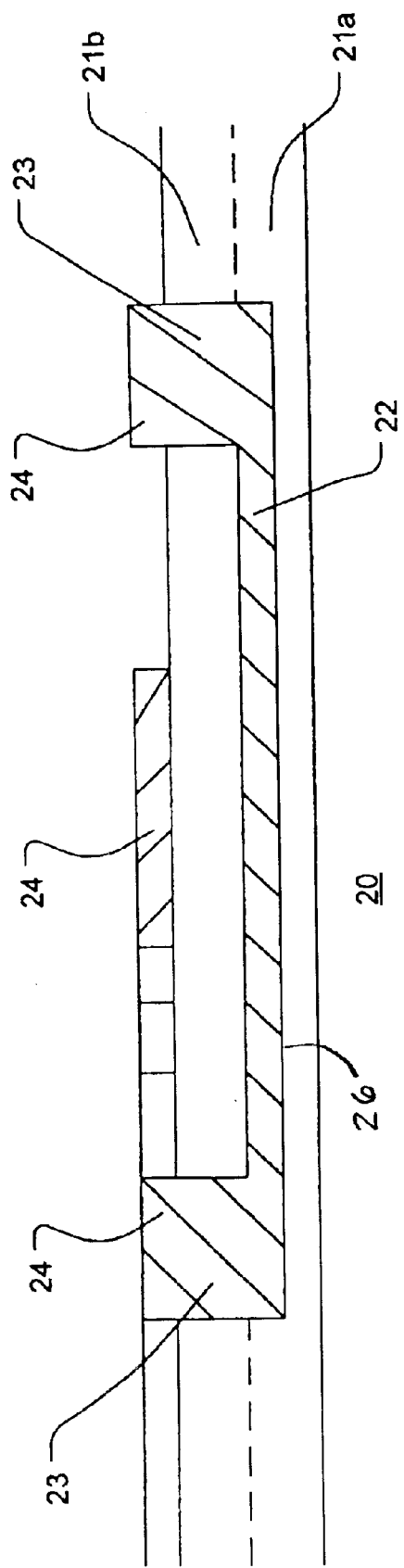
FIG. 3 is a vertical sectional view of part of the inductive structure of FIG. 2.

Referring to FIG. 3, the inductive structure is formed on a silicon substrate 20. During manufacture, a first $SiO_2$ layer is formed on the substrate 20 and then partially etched through to form troughs 26 for the underpass of the inductors 4, 5 and the positive voltage line 6. Metal 22, e.g. Al or Cu, is deposited in troughs and a second $SiO_2$ layer 21b is formed over the metal 22 and the first $SiO_2$ layer 21a. The second $SiO_2$ layer 21b is then etched to form vias at either end of the troughs and metal 23 is deposited in the vies. Finally, metal 24 is deposited to connect the vies to form the inductors 4, 5 and the peripheral paths 10, 11.

What is claimed is:

1. A push-pull amplifier including:
   a substrate;
   load inductors comprising first and second inductors connected in series at a node and formed on the substrate, the inductors spiralling in opposite senses from side-by-side start positions about a common center in substantially the same plane;
   a power supply line connected to said node; and
   first and second output points connected respectively to the first and second inductors.

2. A push-pull amplifier according to claim 1, wherein the first inductor alternately passes over and under the second inductor as it spirals about said center.

3. A push-pull amplifier according to claim 2, wherein the first inductor passes under the second inductor in a trough formed in a dielectric layer on the substrate.

4. A push-pull amplifier according to claim 2, wherein the spiralling in of the inductors is caused by inward path transitions where the first inductor passes over or under the second inductor.

5. A push-pull amplifier according to claim 1, wherein the turns of inductors are substantially rectangular.

6. A push-pull amplifier according to claim 5, wherein said turns are substantially square.

7. A push-pull amplifier according to claim 1, exhibiting at least one degree of mirror symmetry, to a substantial extent, along a line in said plane.

8. A push-pull amplifier according to claim 1, including output signal paths following peripheral routes around the respective halves of the load inductors.

* * * * *